(12) United States Patent
Lenoble et al.

(10) Patent No.: US 7,416,950 B2
(45) Date of Patent: Aug. 26, 2008

(54) MOS TRANSISTOR FORMING METHOD

(75) Inventors: Damien Lenoble, Saint-Gilles (BE); Fabrice Lallement, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 106 days.

(21) Appl. No.: 11/351,287

(22) Filed: Feb. 9, 2006

(65) Prior Publication Data

US 2006/0177976 A1 Aug. 10, 2006

(30) Foreign Application Priority Data

Feb. 9, 2005 (FR) .................................. 05 50374

(51) Int. Cl.
*H01L 21/336* (2006.01)

(52) U.S. Cl. ....................... 438/306; 438/513

(58) Field of Classification Search ................. 438/301, 438/305–306, 513, 231–232, 515
See application file for complete search history.

(56) References Cited

U.S. PATENT DOCUMENTS

| 5,561,072 | A | 10/1996 | Saito | |
|---|---|---|---|---|
| 6,242,314 | B1 * | 6/2001 | Chen et al. | 438/384 |
| 6,380,021 | B1 * | 4/2002 | Wang et al. | 438/232 |
| 6,395,593 | B1 * | 5/2002 | Pendharkar et al. | 438/207 |
| 6,465,335 | B1 * | 10/2002 | Kunikiyo | 438/592 |
| 2005/0191827 | A1 * | 9/2005 | Collins et al. | 438/513 |
| 2006/0043531 | A1 * | 3/2006 | Erokhin et al. | 257/607 |

OTHER PUBLICATIONS

Quirk et al., "Characteristics of Semiconductor Materials", Semiconductor Manufacturing Technology, Prentice Hall, 2001, pp. 33-37.*
French Search Report from French Patent Application 05/50374, filed Feb. 9, 2005.
Patent Abstracts of Japan, vol. 1998, No. 14, Dec. 31, 1998 & JP 10 256175 A (Yamaha Corp.), Sep. 25, 1998.
Patent Abstracts of Japan vol. 1995, No. 06, Jul. 31, 1995 & JP 07 086196 A (Sony Corp.), Mar. 31, 1995.
Patent Abstracts of Japan vol. 014, No. 139 (E-0903), Mar. 15, 1990 & JP 02 003915 A (Matsushita Electron Corp.), Jan. 9, 1990.

* cited by examiner

*Primary Examiner*—M. Wilczewski
*Assistant Examiner*—Toniae M. Thomas
(74) *Attorney, Agent, or Firm*—Lisa K. Jorgenson; James H. Morris; Wolf, Greenfield & Sacks, P.C.

(57) ABSTRACT

A method for forming, in a single-crystal semiconductor substrate of a first conductivity type, doped surface regions of the second conductivity type and deeper doped regions of the first conductivity type underlying the surface regions, including the step of negatively biasing the substrate placed in the vicinity of a plasma including, in the form of cations dopants of the first conductivity type and dopants of a second conductivity type, the dopants of the second conductivity type having an atomic mass which is greater than that of the dopants of the first conductivity type.

50 Claims, 1 Drawing Sheet

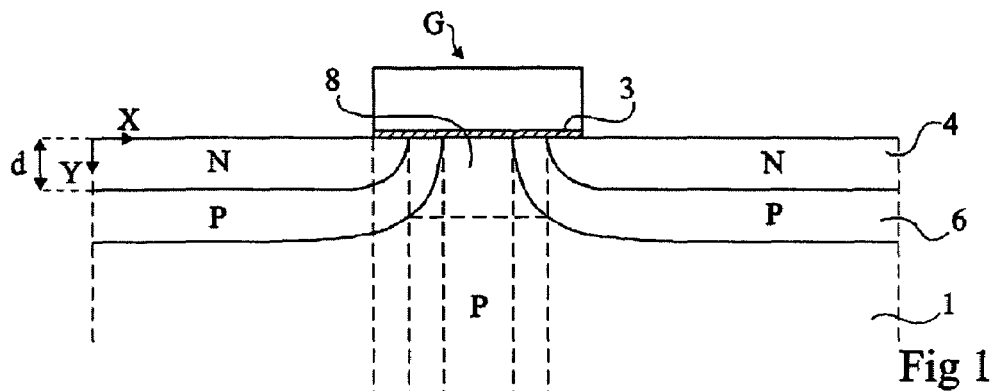
Fig 1
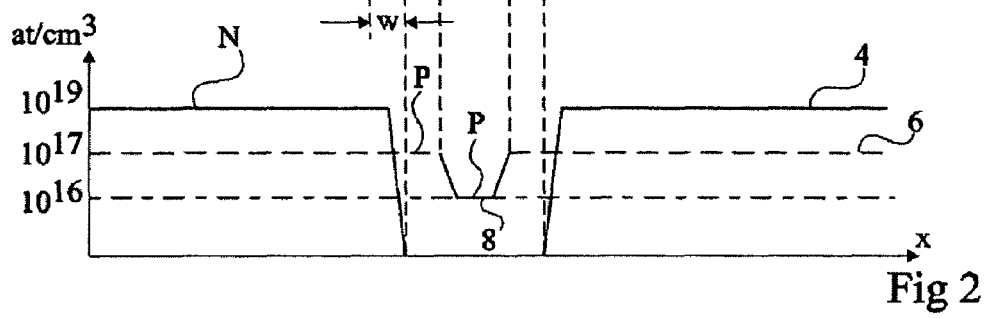
Fig 2
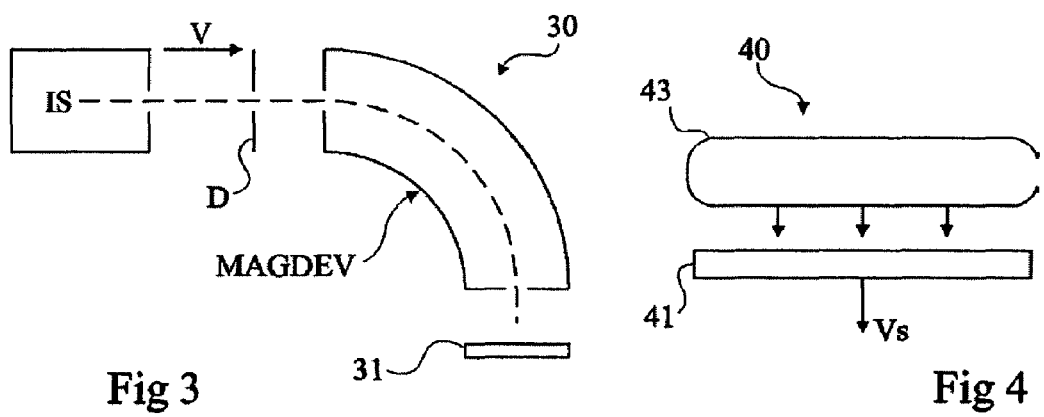
Fig 3
Fig 4
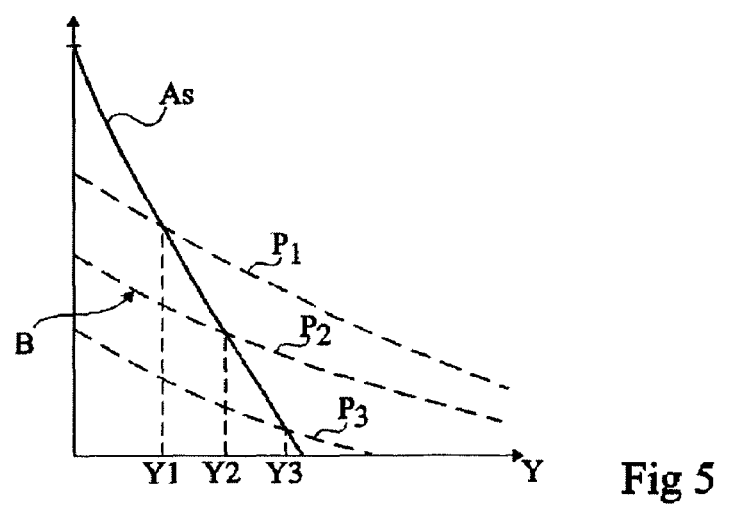
Fig 5

MOS TRANSISTOR FORMING METHOD

BACKGROUND OF THE INVENTION

1. Field of the Invention

The present invention generally relates to the manufacturing of MOS transistors in a semiconductor substrate. More specifically, the present invention relates to the manufacturing of transistors having a gate of a length smaller than 100 nm.

2. Discussion of the Related Art

Certain MOS transistors comprise pockets of a same first conductivity type but more heavily doped than the substrate, at the surface of which are formed lightly-doped regions (LDD) of the second conductivity type and heavily-doped surface regions (HDD) of the second conductivity type.

The present invention will be described hereafter in relation with the forming of an N-channel MOS transistor formed in a P-type doped silicon substrate. FIG. 1 illustrates, in a partial simplified cross-section view, an N-channel MOS transistor at an intermediary step of its manufacturing according to a known method.

The method starts with the definition of a gate G insulated from the surface of substrate 1 by a thin insulator 3. The method continues with the forming by implantation, at the substrate surface, of N-type lightly-doped regions (LDD) 4 on either side of gate G. In this implantation, gate G is used as an implantation mask. Pockets 6 of the same conductivity type as substrate 1 are also formed by implantation. The pockets are more heavily doped than the substrate, but less heavily than regions 4. Pockets 6 are formed between regions 4 and substrate 1. The pockets are generally formed, as illustrated in FIG. 1, along the entire junction between the substrate and regions 4, gate G being also used as an implantation mask.

The two successive implantations of the dopants of regions 4 and of pockets 6 are performed in any order.

The same diffusion anneal during which the dopants of regions 4 and of pockets 6 diffuse to provide the structure of FIG. 1 is then performed. This anneal can be performed at the end of the transistor forming process, after the implantation (not shown) of N-type dopants at the surface of regions 4 to form heavily-doped drain and source regions (HDD).

FIG. 2 schematically illustrates the doping profiles of the structure of FIG. 1 after the diffusion anneal. The abscissa axis corresponds to horizontal direction X of FIG. 1. As described previously, channel region 8 underlying gate G exhibits a small P-type doping and is separated from LDD lightly-doped N-type regions 4 by superficial portions of pockets 6 more heavily P-type doped than substrate 1, but less heavily doped than regions 4. As an example, the doping of substrate 1 and of channel region 8 is on the order of from $10^{15}$ to $10^{18}$ at·cm$^{-3}$, the surface doping of regions 4 is on the order of from $10^{18}$ to $10^{20}$ at·cm$^{-3}$, and the doping of pockets 6 is from $10^{16}$ to $10^{19}$ at·cm$^{-3}$.

Pockets 6 are often used in transistors with small gate lengths to limit uncontrolled untimely switching problems imputed to so-called short channel effects. Such short channel effects are due to the diffusion of the dopants of regions 4 under gate G. Indeed, in the anneal performed to obtain regions 4 of an appropriate depth d, on the order of 20 nm, the dopants also diffuse under gate G with a diffusion length W. In operation, in the absence of pockets 6, in a biasing of regions 4, space charge areas create between regions 4 and substrate 1. Such space charge areas mostly extend into substrate 1, more lightly doped than regions 4. When gate G is narrow, the space charge areas extend until they cover each other. The control of the channel establishment by the gate is then lost.

The presence of pockets 6 more heavily P-type doped than substrate 1 enables limiting the extent of the space charge areas to these pockets. This enables keeping, in substrate 1, a channel area 8 controlled by the sole biasing of gate G.

FIG. 3 schematically illustrates a type of known implantation device 30 with a magnetic deviation dopant species selection. A target is ionized in a cation source IS. The cation flow coming out of chamber IS is accelerated under a potential difference V. The obtained beam is collimated by a diaphragm D and sent into a magnetic deviation chamber MAGDEV where a cation mass discrimination is performed. Indeed, from a given target, a great number of cations is obtained. For example, for a P-type doping by means of boron, a source of boron trifluoride $BF_3$ which provides, on ionization, cations $B^+$, $BF^+$, $BF_2^+$, and $BF_3^+$, is used. Magnetic deviation circuit MAGDEV enables only selecting the cations $B^+$ which are sent to wafer 31 to be implanted. Thus, fundamentally, this type of device only enables implanting a single species (ionized atom or molecule) and dopant type.

FIG. 4 schematically illustrates another type of known plasma implantation device 40 generally used for extremely fine implantations. In device 40, a plasma 43 is created in the vicinity of a wafer 41. Plasma 43 comprises, in the form of cations that can be dispersed in an inert carrier gas such as argon or xenon, a species to be implanted. The wafer is biased to a negative reference voltage Vs. Then, the cations implant into wafer 41. Device 40 enables performing implantations at reduced implantation powers with respect to device 30. The penetration depths of the doping cations is then reduced.

Whatever the used implantation device 30 or 40, two successive N-type and P-type implantations are performed, in an indifferent order, to obtain the structure of FIG. 1 and the diffusion profiles illustrated in FIG. 2.

A disadvantage of such a MOS transistor forming method lies in the long times linked to the implantations and the costs of use of two separated implanters.

SUMMARY OF THE INVENTION

The present invention accordingly aims at providing a MOS transistor forming method with reduced costs.

More specifically, the present invention aims at providing such a method in which the number of implantation steps is reduced.

To achieve these and other objects, the present invention provides a method for forming, in a single-crystal semiconductor substrate of a first conductivity type, doped surface regions of the second conductivity type and deeper doped regions of the first conductivity type underlying said surface regions. The present invention provides the step of negatively biasing the substrate placed in the vicinity of a plasma comprising in the form of cations dopants of the first conductivity type and dopants of a second conductivity type, the dopants of the second conductivity type having an atomic mass which is greater than that of the dopants of the first conductivity type.

According to an embodiment of the present invention, the dopant of the first conductivity type is boron and the dopant of the second conductivity type is phosphorus, arsenic, or antimony.

According to an embodiment of the present invention, the dopant of the first conductivity type is phosphorus and the dopant of the second conductivity type is indium.

According to an embodiment of the present invention, a negative biasing voltage of the substrate is set according to the implantation depths of the dopants of the first desired conductivity type and the partial pressures of the dopants of the first and of the second conductivity type in the plasma are set according to the desired doses/concentrations and to the depth of the limit between doped surface regions of the second conductivity type and doped deep regions of the first conductivity type.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 1 is a partial simplified cross-section view of an N-channel MOS transistor at an intermediary step of its manufacturing;

FIG. 2 is a diagram illustrating the dopant concentration profile at the surface of FIG. 1;

FIG. 3 schematically illustrates a device of implantation by magnetic deviation;

FIG. 4 schematically illustrates a plasma implantation device; and

FIG. 5 is a diagram schematically illustrating the profiles of doses implanted according to the present invention before a diffusion anneal.

DETAILED DESCRIPTION

For clarity, the same elements have been designated with the same reference numerals in the different drawings and, further, the various drawings are not to scale.

Conventionally, in an implantation by device 30 of FIG. 3 or by device 40 of FIG. 4, a single electrically-active dopant is implanted. In the case of plasma device 40, the ionized dopant may be diluted in an inert neutral gas, such as argon or xenon, that may be ionized and implanted but which is electrically neutral. Further, even if several cations, for example, $B^+$, $BF^+$, $BF_2^+$, and $BF_3^+$, are implanted, a single species, boron B, is electrically active. The other species, F, is electrically neutral.

The present invention is based on the awareness by the inventors that, conversely to a general prejudice, a plasma-type implanter may be used to simultaneously implant dopants of different types. This enables reducing manufacturing costs by simultaneously forming the LDD regions and the MOS transistor pockets of reduced dimensions in a same implantation step performed in the same plasma implanter.

The implantation is then performed for the two types of dopants under the same power set by the biasing of the implanted wafer. However, the speed at which the cations hit the wafer depends on their mass and heavy cations are less heavily implanted than light cations. Then, to form in a same implantation LDD regions 4 and pockets 6 of FIG. 1, the dopants are selected so that the cations intended to form region 4 are heavier than the cations intended to form region 6.

As for the concentrations, that is, the implanted doses, they are set by the relative proportions of the partial pressures of the dopants present in the plasma. Thus, to obtain LDD regions 4 more heavily doped than pockets 6, the partial pressure of the dopant of the LDD regions is set to a value higher than that of the pocket dopant. For example, the gas supply rates of the plasma chamber are set so that the flow rate of the dopant intended to form LDD regions is approximately twenty times as high as that of the dopant intended to form pockets.

As an example, to form an N-channel MOS transistor, a plasma based on arsenic pentafluoride $AsF_5$ and on boron trifluoride $BF_3$ is used. From the arsenic pentafluoride, mostly $AsF_3^+$ and $AsF_4^+$ cations, which have a respective molecular mass of 132 and 151, are obtained. From the boron trifluoride, mostly cations $B^+$, $BF^+$, and $BF_2^+$ of respective molecular mass of 11, 30, and 49, are obtained. To obtain a concentration difference of a factor 100 at the junction, the gas flow rates will be adjusted so that the arsenic pentafluoride flow rate is approximately twenty times greater than that of boron trifluoride.

FIG. 5 schematically illustrates the profile of the implanted doses of arsenic in full lines and of boron in dotted lines. The abscissa corresponds to vertical direction Y of FIG. 1, outside of the region underlying gate G. The arsenic, being heavier, concentrates at the surface of substrate 1 and its concentration substantially linearly decreases. The boron, which is lighter, penetrates into the structure. Depth Y for which the boron concentration becomes greater than that of arsenic depends on its initial concentration in the plasma. This depth corresponds to the limit between regions 4 and pockets 6 of FIG. 1. Thus, if the partial pressure of boron trifluoride $P(BF_3)$ in the plasma decreases: $P_1(BF_3) > P_2(BF_3) > P_3(BF_3)$, then the depth of pockets 6 increases ($Y_1 < Y_2 < Y_3$).

The present inventors advantageously exploit what used to be considered up to now as disadvantages of plasma implantation, that is, the non-selectivity of the implanted species, and the low implantation power. The non-selectivity enables a co-implantation. The low power enables limiting the implantation depth of LDD regions 4. Despite the low power, pockets 6 can be sufficiently deeply implanted by using a light dopant.

Further, the implantation duration is significantly decreased with respect to that of a conventional ion implantation. This reduces the costs linked to the utilization period of the materials. This adds to the advantage of the co-implantation which eliminates the cost linked to the use of two implantation devices, each being dedicated to the implantation of a type of dopants.

Of course, the present invention is not limited to the forming of N-channel transistors by co-implantation of arsenic and boron. Other co-implantations may be used, provided that the mass of the N-type dopant implanted at the surface is greater than that of the P-type dopant implanted in the pockets. As an example, if the boron in the form of boron trifluoride is the P-type dopant, arsenic as well as phosphorus (P, atomic mass 31) in the form of $PF_3$, $PF_5$, $PH_3$, as well as antimony (Sb, of atomic mass 122) in the form of $SbH_3$, may be used as the N-type dopant. Preferably, antimony, which is the heaviest and accordingly which will be best separated from boron, will be used.

Further, the dopant supply form, that is, the molecular combination of the ionized target and the corresponding cations, may be of any kind, provided that the dopants of the complementary conductivity type which are desired to be implanted are associated with an electrically neutral species such as fluoride. It being a silicon substrate, the dopants may also be brought in the form of chloride or hydride.

It is also possible to form P-channel MOS transistors of small dimensions by using a single co-implantation according to the present invention to form P-type LDD regions and N-type pockets. For example, indium, of atomic mass 114, is used as a P-type dopant, and phosphorus is used as an N-type dopant.

Of course, the present invention is likely to have various alterations, modifications, and improvements which will readily occur to those skilled in the art. In particular, it will be readily understood by those skilled in the art that only those elements of a MOS transistor necessary to the understanding of the present invention have been described and shown. It will be within the abilities of those skilled in the art to complete the previously-described method to obtain the full structure of a MOS transistor. Thus, it will be within the abilities of those skilled in the art, for example, after the co-implantation according to the present invention, to form spacers on the lateral walls of gate G, to use these spacers and the gate as an implantation mask of heavily-doped source/drain regions (HDD), to silicide the surfaces of the HDD regions thus obtained, and to form contacts with each of the source/drain and gate regions.

Further, those skilled in the art will understand that the present invention generally applies to the simultaneous forming in a semiconductor substrate of two complementary superposed regions of opposite conductivity types.

It will be within the abilities of those skilled in the art to select a device 40 capable of implementing the method according to the present invention. It will be, for example, a plasma reactor comprising an enclosure provided with a bottom on which is placed a support or susceptor that may be isolated form the bottom and which is capable of receiving a wafer to be implanted. The plasma is created by any means, for example, by a radio-frequency field and may be confined by electromagnetic fields. Of course, the enclosure comprises means of gas introduction, circulation, and extraction and possibly means for setting a temperature, for example, of support cooling, as well as bias means. The plasma then extends in the entire enclosure and in any case to the vicinity of the wafer to be implanted, as shown in FIG. 4.

Further, "substrate" is used to designated a uniformly-doped silicon wafer as well as epitaxial areas and/or these areas being specifically doped by implantation/diffusion formed on or in a massive substrate.

Generally, although the present invention has been described in the context of a silicon manufacturing process, it applies to any integrated circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming, in a single-crystal semiconductor substrate of a first conductivity type, doped surface regions of a second conductivity type and, simultaneously with the doped surface regions of the second conductivity type, deeper doped regions of the first conductivity type underlying said surface regions, comprising negatively biasing the substrate placed in a vicinity of a plasma comprising cations of dopants of the first conductivity type and cations of dopants of a second conductivity type, the dopants of the second conductivity type having an atomic mass which is greater than that of the dopants of the first conductivity type.

2. The method of claim 1, wherein the dopant of the first conductivity type comprises boron and the dopant of the second conductivity type comprises one of phosphorus, arsenic, and antimony.

3. The method of claim 1, wherein the dopant of the first conductivity type comprises phosphorus and the dopant of the second conductivity type comprises indium.

4. A method for forming, in a single-crystal semiconductor substrate of a first conductivity type, doped surface regions of the second conductivity type and deeper doped regions of the first conductivity type underlying said surface regions, comprising negatively biasing the substrate placed in a vicinity of a plasma comprising cations of dopants of the first conductivity type and cations of dopants of a second conductivity type, the dopants of the second conductivity type having an atomic mass which is greater than that of the dopants of the first conductivity type, wherein a negative biasing voltage of the substrate is set according to implantation depths of the dopants of the first conductivity type and partial pressures of the dopants of the first and of the second conductivity type in the plasma are set according to desired doses/concentrations and to a depth of a limit between doped surface regions of the second conductivity type and doped deep regions of the first conductivity type.

5. A method for forming a MOS transistor comprising, in a single-crystal semiconductor substrate of a first conductivity type, lightly-doped surface regions of a second conductivity type formed in pockets more heavily-doped of the first conductivity type than the substrate and less heavily doped than the surface regions, in which the surface regions and the pockets are formed simultaneously by forming, in the single-crystal semiconductor substrate of the first conductivity type, doped surface regions of the second conductivity type and deeper doped regions of the first conductivity type underlying said surface regions, comprising negatively biasing the substrate placed in a vicinity of a plasma comprising cations of dopants of the first conductivity type and cations of dopants of a second conductivity type, the dopants of the second conductivity type having an atomic mass which is greater than that of the dopants of the first conductivity type.

6. A method for forming a semiconductor, the method comprising:
   providing a semiconductor substrate;
   simultaneously implanting dopants of different conductivity types into the substrate using a single implanter; and
   simultaneously forming a lightly doped region and MOS transistor pockets in a same implantation step using the single implanter.

7. The method of claim 6, wherein simultaneously forming the lightly doped region and the pockets comprises selecting a first dopant having first cations and selecting a second dopant having second cations, wherein the first cations are heavier than the second cations and wherein the first cations are used to form the lightly doped region and the second cations are used to form the pockets.

8. A method for forming a semiconductor, the method comprising:
   providing a semiconductor substrate;
   simultaneously implanting dopants of different conductivity types into the substrate using a single implanter;
   wherein simultaneously implanting dopants of different conductivity types into the substrate comprises simultaneously implanting dopant of a first conductivity type to form a first region and dopant of a second conductivity type to form a second region; and
   setting a partial pressure of the dopant of the first region at a higher value than a partial pressure of the dopant of the second region.

9. A method for forming a semiconductor, the method comprising:
   providing a semiconductor substrate;
   simultaneously implanting dopants of different conductivity types into the substrate using a single implanter;
   wherein simultaneously implanting dopants of different conductivity types into the substrate comprises simultaneously implanting dopant of a first conductivity type to form a first region and dopant of a second conductivity type to form a second region; and setting a gas supply flow rate of the single implanter so that a flow rate of the dopant intended to form the first region is higher than a flow rate of the dopant intended to form the second region.

10. A method for forming a semiconductor, the method comprising:

providing a semiconductor substrate; and simultaneously implanting dopants of different conductivity types into the substrate using a single implanter;

wherein simultaneously implanting dopants of different conductivity types comprises simultaneously implanting a first dopant and a second dopant, wherein the second dopant is heavier than the first dopant;

wherein implanting the first dopant comprises forming a lightly doped region and wherein implanting the second dopant comprises forming a pocket.

11. A method for forming a semiconductor, the method comprising:

providing a semiconductor substrate; and simultaneously implanting dopants of different conductivity types into the substrate using a single implanter;

wherein simultaneously implanting dopants of different conductivity types into the substrate using a single implanter comprises simultaneously implanting dopants of different conductivity types into the substrate suing a single plasma-type implanter.

12. The method of claim 6, wherein simultaneously implanting dopants of different conductivity types comprises simultaneously implanting a first dopant comprising boron and implanting a second dopant comprising one of arsenic, phosphorous and antimony.

13. The method of claim 6 wherein simultaneously implanting dopants of different conductivity types comprises simultaneously implanting a first dopant comprising phosphorous and implanting a second dopant comprising indium.

14. The method of claim 6, wherein simultaneously implanting dopants of different conductivity types comprises simultaneously implanting an N-type dopant and a P-type dopant.

15. The method of claim 4, wherein the dopant of the first conductivity type comprises boron and the dopant of the second conductivity type comprises one of phosphorus, arsenic, and antimony.

16. The method of claim 4, wherein the dopant of the first conductivity type comprises phosphorus and the dopant of the second conductivity type comprises indium.

17. The method of claim 4, in combination with a method for forming a MOS transistor comprising, in a single-crystal semiconductor substrate of a first conductivity type, lightly-doped surface regions of a second conductivity type formed in pockets more heavily-doped of the first conductivity type than the substrate and less heavily doped than the surface regions, in which the surface regions and the pockets are formed simultaneously by the method of claim 4.

18. The method of claim 8, further comprising simultaneously forming a lightly doped region and MOS transistor pockets in a same implantation step using the single implanter.

19. The method of claim 18, wherein simultaneously forming the lightly doped region and the pockets comprises selecting a first dopant having first cations and selecting a second dopant having second cations, wherein the first cations are heavier than the second cations and wherein the first cations are used to form the lightly doped region and the second cations are used to form the pockets.

20. The method of claim 8, further comprising setting a gas supply flow rate of the single implanter so that a flow rate of the dopant intended to form the first region is higher than a flow rate of the dopant intended to form the second region.

21. The method of claim 20, wherein setting a gas supply flow rate comprises setting a flow rate of the dopant intended to form the first region to approximately twenty times higher than a flow rate of the dopant intended to form the second region.

22. The method of claim 8, wherein simultaneously implanting dopants of different conductivity types comprises simultaneously implanting a first dopant comprising boron and implanting a second dopant comprising one of arsenic, phosphorous and antimony.

23. The method of claim 8, wherein simultaneously implanting dopants of different conductivity types comprises simultaneously implanting a first dopant comprising phosphorous and implanting a second dopant comprising indium.

24. The method of claim 8, wherein simultaneously implanting dopants of different conductivity types comprises simultaneously implanting an N-type dopant and a P-type dopant.

25. The method of claim 9, further comprising simultaneously forming a lightly doped region and MOS transistor pockets in a same implantation step using the single implanter.

26. The method of claim 25, wherein simultaneously forming the lightly doped region and the pockets comprises selecting a first dopant having first cations and selecting a second dopant having second cations, wherein the first cations are heavier than the second cations and wherein the first cations are used to form the lightly doped region and the second cations are used to form the pockets.

27. The method of claim 9, wherein setting a gas supply flow rate comprises setting a flow rate of the dopant intended to form the first region to approximately twenty times higher than a flow rate of the dopant intended to form the second region.

28. The method of claim 9, wherein simultaneously implanting dopants of different conductivity types comprises simultaneously implanting a first dopant comprising boron and implanting a second dopant comprising one of arsenic, phosphorous and antimony.

29. The method of claim 9, wherein simultaneously implanting dopants of different conductivity types comprises simultaneously implanting a first dopant comprising phosphorous and implanting a second dopant comprising indium.

30. The method of claim 9, wherein simultaneously implanting dopants of different conductivity types comprises simultaneously implanting an N-type dopant and a P-type dopant.

31. The method of claim 10, further comprising simultaneously forming a lightly doped region and MOS transistor pockets in a same implantation step using the single implanter.

32. The method of claim 31, wherein simultaneously forming the lightly doped region and the pockets comprises selecting a first dopant having first cations and selecting a second dopant having second cations, wherein the first cations are heavier than the second cations and wherein the first cations are used to form the lightly doped region and the second cations are used to form the pockets.

33. The method of claim 10, wherein simultaneously implanting dopants of different conductivity types into the substrate comprises simultaneously implanting dopant of a first conductivity type to form a first region and dopant of a second conductivity type to form a second region.

34. The method of claim 33, further comprising setting a partial pressure of the dopant of the first region at a higher value than a partial pressure of the dopant of the second region.

35. The method of claim 33, further comprising setting a gas supply flow rate of the single implanter so that a flow rate of the dopant intended to form the first region is higher than a flow rate of the dopant intended to form the second region.

36. The method of claim 35, wherein setting a gas supply flow rate comprises setting a flow rate of the dopant intended to form the first region to approximately twenty times higher than a flow rate of the dopant intended to form the second region.

37. The method of claim 10, wherein simultaneously implanting dopants of different conductivity types comprises simultaneously implanting a first dopant comprising boron and implanting a second dopant comprising one of arsenic, phosphorous and antimony.

38. The method of claim 10, wherein simultaneously implanting dopants of different conductivity types comprises simultaneously implanting a first dopant comprising phosphorous and implanting a second dopant comprising indium.

39. The method of claim 10, wherein simultaneously implanting dopants of different conductivity types comprises simultaneously implanting an N-type dopant and a P-type dopant.

40. The method of claim 11, further comprising simultaneously forming a lightly doped region and MOS transistor pockets in a same implantation step using the single implanter.

41. The method of claim 39, wherein simultaneously forming the lightly doped region and the pockets comprises selecting a first dopant having first cations and selecting a second dopant having second cations, wherein the first cations are heavier than the second cations and wherein the first cations are used to form the lightly doped region and the second cations are used to form the pockets.

42. The method of claim 11, wherein simultaneously implanting dopants of different conductivity types into the substrate comprises simultaneously implanting dopant of a first conductivity type to form a first region and dopant of a second conductivity type to form a second region.

43. The method of claim 42, further comprising setting a partial pressure of the dopant of the first region at a higher value than a partial pressure of the dopant of the second region.

44. The method of claim 42, further comprising setting a gas supply flow rate of the single implanter so that a flow rate of the dopant intended to form the first region is higher than a flow rate of the dopant intended to form the second region.

45. The method of claim 44, wherein setting a gas supply flow rate comprises setting a flow rate of the dopant intended to form the first region to approximately twenty times higher than a flow rate of the dopant intended to form the second region.

46. The method of claim 11, wherein simultaneously implanting dopants of different conductivity types comprises simultaneously implanting a first dopant and a second dopant, wherein the second dopant is heavier than the first dopant.

47. The method of claim 46, wherein implanting the first dopant comprises forming a lightly doped region and wherein implanting the second dopant comprises forming a pocket.

48. The method of claim 11, wherein simultaneously implanting dopants of different conductivity types comprises simultaneously implanting a first dopant comprising boron and implanting a second dopant comprising one of arsenic, phosphorous and antimony.

49. The method of claim 11, wherein simultaneously implanting dopants of different conductivity types comprises simultaneously implanting a first dopant comprising phosphorous and implanting a second dopant comprising indium.

50. The method of claim 11, wherein simultaneously implanting dopants of different conductivity types comprises simultaneously implanting an N-type dopant and a P-type dopant.

\* \* \* \* \*

UNITED STATES PATENT AND TRADEMARK OFFICE
CERTIFICATE OF CORRECTION

PATENT NO.        : 7,416,950 B2                                Page 1 of 1
APPLICATION NO.   : 11/351287
DATED             : August 26, 2008
INVENTOR(S)       : Damien Lenoble et al.

It is certified that error appears in the above-identified patent and that said Letters Patent is hereby corrected as shown below:

Col. 7, claim 11, line 27 should read:
of different conductivity types into the substrate using a Signed and Sealed this Twenty-ninth Day of June, 2010

David J. Kappos
*Director of the United States Patent and Trademark Office*